(12) United States Patent
Jones et al.

(10) Patent No.: US 7,944,746 B2
(45) Date of Patent: May 17, 2011

(54) ROOM TEMPERATURE DRIFT SUPPRESSION VIA SOFT PROGRAM AFTER ERASE

(75) Inventors: Gwyn Robert Jones, Sunnyvale, CA (US); Mark W Randolph, San Jose, CA (US); John Darilek, Bastrop, TX (US); Sean O'Mullan, Austin, TX (US); Jacob Marcantel, Dripping Spring, TX (US); Rick Anundson, Austin, TX (US); Adam Shackleton, Austin, TX (US); Xiaojian Chu, Austin, TX (US); Abhijit Raghunathan, Austin, TX (US); Asif Arfi, Austin, TX (US); Gulzar Ahmed Kathawala, Santa Clara, CA (US); Zhizheng Liu, San Jose, CA (US); Sung-Chul Lee, Cupertino, CA (US)

(73) Assignee: Spansion LLC, Sunnyvale, CA (US)

( * ) Notice: Subject to any disclaimer, the term of this patent is extended or adjusted under 35 U.S.C. 154(b) by 464 days.

(21) Appl. No.: 11/945,785

(22) Filed: Nov. 27, 2007

(65) Prior Publication Data
US 2009/0135659 A1   May 28, 2009

(51) Int. Cl.
*G11C 16/06* (2006.01)
*G11C 16/10* (2006.01)
*G11C 16/14* (2006.01)

(52) U.S. Cl. ............ 365/185.09; 365/185.29; 365/185.3; 365/185.18; 365/185.02

(58) Field of Classification Search ............. 365/185.09, 365/185.18, 185.29, 185.3, 185.02
See application file for complete search history.

(56) References Cited

U.S. PATENT DOCUMENTS

| 6,285,588 B1 * | 9/2001 | Fastow ..................... 365/185.19 |
| 6,643,181 B2 * | 11/2003 | Sofer et al. ............... 365/185.22 |
| 6,834,012 B1 * | 12/2004 | He et al. ................... 365/185.18 |
| 2005/0073886 A1 * | 4/2005 | Hamilton et al. ........ 365/185.29 |
| 2005/0237813 A1 * | 10/2005 | Zous et al. ............... 365/185.24 |

* cited by examiner

*Primary Examiner* — J. H. Hur
(74) *Attorney, Agent, or Firm* — Turocy & Watson, LLP

(57) ABSTRACT

Providing for suppression of room temperature electronic drift in a flash memory cell is provided herein. For example, a soft program pulse can be applied to the flash memory cell immediately after an erase pulse. The soft program pulse can help to mitigate dipole effects caused by non-combined electrons and holes in the memory cell. Specifically, by utilizing a relatively low gate voltage, the soft program pulse can inject electrons into the flash memory cell proximate a distribution of uncombined holes associated with the erase pulse in order to facilitate rapid combination of such particles. Rapid combination in this manner reduces dipole effects caused by non-combined distributions of opposing charge within the memory cell, reducing room temperature program state drift.

25 Claims, 11 Drawing Sheets

ROOM TEMPERATURE DRIFT SUPPRESSION VIA SOFT PROGRAM AFTER ERASE

BACKGROUND

Memory devices have a wide variety of uses in modern electronic devices, including devices such as cellular phones, personal computers, laptops, personal digital assistants, camcorders, voice recorders, portable storage drives for such devices, and the like. As memory devices become smaller, less expensive to manufacture, and capable of storing larger amounts of information, they become viable products for larger segments of the current electronic technology. Consequently, as consumer demand and available markets for electronic memory increases, additional memory device technologies are developed to fully leverage capabilities of electronic devices in such markets. Flash memory, for example, is one type of electronic memory media that can store, erase and restore data. Furthermore, flash memory, unlike some types of electronic memory, can retain stored data without exposure to continuous electrical power. Flash memory has become a popular device for consumer electronics, due in part to a combination of the high density and low cost of erasable programmable read only memory (EPROM) and electrical erasability introduced with electronically erasable programmable read only memory (EEPROM). In addition to combining these benefits, flash memory is nonvolatile (e.g., flash memory can be removed from a power source without losing stored data). Consequently, it has become a useful and popular mechanism for storing, transporting, sharing and maintaining data.

As flash memory has become more popular as a consumer product, more uses are discovered for such memory. Some uses include storage of sensitive and/or long-term data. For instance, pictures and other memorabilia can be stored by way of flash memory. The long life and storage integrity of flash memory provides an ideal mechanism to store such data. However, even the most robust flash memory can suffer from some drawbacks that can be detrimental to data. One such drawback is called memory cell drift, where a cell level (e.g., corresponding to a level of charge, voltage, and/or current of the cell) that corresponds to a particular program state changes over time. Severe drift can cause data to be lost if the cell level changes to a degree that a desired/intended program state is no longer distinguishable from other program states. Typically such problems occur only over long periods of time. But for sensitive and/or long-term data, such as digital photographs, data integrity may be desired for decades or longer. Accordingly, even slow acting drift can be problematic.

SUMMARY

The following presents a simplified summary of the innovation in order to provide a basic understanding of some aspects described herein. This summary is not an extensive overview of the disclosed subject matter. It is intended to neither identify key or critical elements of the disclosed subject matter nor delineate the scope of the subject innovation. Its sole purpose is to present some concepts of the disclosed subject matter in a simplified form as a prelude to the more detailed description that is presented later.

Providing for suppression of room temperature electronic drift in a flash memory cell is provided herein. For example, a soft program pulse can be applied to the flash memory cell immediately after an erase pulse. The soft program pulse can help to mitigate dipole effects caused by non-combined electrons and holes (e.g., sub-atomic particle having opposite charge as an electron) in the memory cell. Specifically, the soft program pulse can inject electrons into the flash memory cell proximate a distribution of holes in order to facilitate rapid combination of pairs of electrons and holes. Such combination reduces dipole effects caused by non-combined distributions of opposing charges within the memory cell, reducing room temperature program state drift.

According to additional aspects of the subject disclosure, a soft program pulse following an erase pulse can be controlled so as to facilitate more rapid combination of pairs of electrons and holes. For instance, a relatively low gate and/or drain voltage can be applied to the flash memory cell during the soft program pulse. Accordingly, injected electrons will be placed proximate a channel region of the memory cell, where holes typically reside following the erase pulse. Proximity of the holes and the injected electrons can result in more rapid hole combination, reducing initial dipole drift that typically occurs immediately after the erase pulse. Accordingly, the subject specification provides for a reduced dipole effect immediately after occurrence of an erase pulse.

According to still other aspects, a gate and/or drain voltage of a flash memory cell can be controlled in order to position holes associated with an erase pulse into a particular location within the flash memory cell. Specifically, a low gate and/or drain voltage, relative to gate/drain voltage utilized to program the memory cell, can be utilized for the erase pulse. As a result, injected holes can be positioned more reliably in a channel region of the memory cell. A subsequent soft program pulse can also be executed with relatively low gate and/or drain voltage at the flash memory cell, to position electrons injected during the soft program pulse near to the injected holes. In addition, a pulse width of the soft program pulse can be controlled in order to balance the total charge within the flash memory cell. Specifically, a small pulse width can be utilized in order to minimize charge injected as a result of the soft program pulse and to keep the memory cell close to a default level of charge associated with an erased state. Accordingly, dipole effects within a flash memory cell can be reduced while maintaining a default erase and/or program state for the memory cell.

To the accomplishment of the foregoing and related ends, the one or more aspects comprise the features hereinafter fully described and particularly pointed out in the claims. The following description and the annexed drawings set forth in detail certain illustrative aspects of the one or more aspects. These aspects are indicative, however, of but a few of the various ways in which the principles of various aspects can be employed and the described aspects are intended to include all such aspects and their equivalents.

DETAILED DESCRIPTION

Figure 1:
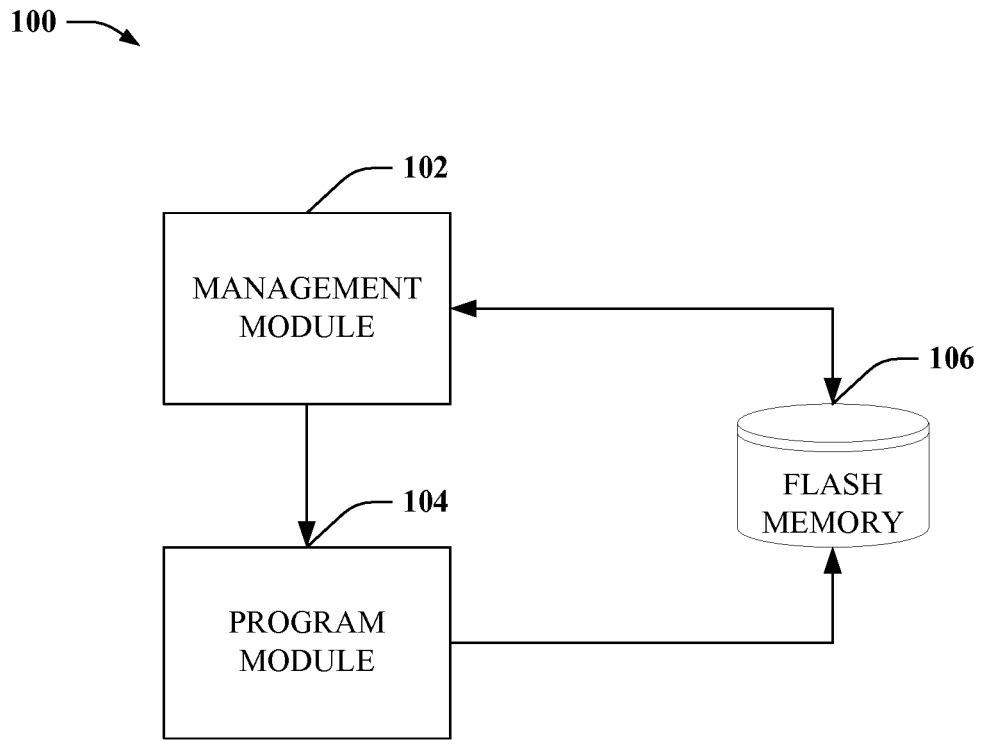
FIG. 1 illustrates a sample system that provides reduced electron drift for flash memory cells in an erased state according to one or more aspects.

Various aspects are now described with reference to the drawings, wherein like reference numerals are used to refer to like elements throughout. In the following description, for purposes of explanation, numerous specific details are set forth in order to provide a thorough understanding of one or more aspects. It can be evident, however, that such aspect(s) can be practiced without these specific details. In other instances, well-known structures and devices are shown in block diagram form in order to facilitate describing one or more aspects.

Flash memory utilizes cells that can store distinguishable levels of voltage, electric charge and/or current (hereinafter referred to as cell levels) to represent an un-programmed state and one or more programmed states. A flash memory cell(s) can be programmed and/or erased to set the cell(s) to one of the distinguishable cell levels that represent the states. For instance, a flash memory cell can be programmed by increasing or decreasing, depending on convention defining relationships between program state and cell level, a stored electric charge to a predetermined cell level. According to one typical convention, cell level and program state can be increased by injecting electrons into the flash memory cell (e.g., by way of band to band tunneling or the like). In addition, the flash memory cell can be erased and/or programmed to a lower cell level/program state by decreasing stored electric charge through injecting holes (e.g., sub-atomic particles having opposite charge as an electron) into the flash memory cell. Because holes have an opposite charge as electrons, electrons and holes can combine to form a neutral (e.g., charge-less) particle, or can simply cancel any net charge pertaining to the memory cell. By setting multiple memory cells to various distinguishable program states, digital information (e.g., binary words) can be stored, read, copied and/or erased.

Programming and erasing memory cells to distinguishable cell levels representing states can be performed in a relatively reliable manner by way of various conventional techniques. However, a cell level, once set, can often drift away from an intended value due to various physical phenomena associated with flash memory cells. One such phenomenon that causes cell level drift in a flash memory cell is dipole attraction. A dipole interaction in a flash memory cell can result if distributions of oppositely charged electronic particles (e.g., distributions of electrons and/or holes) stored in the memory cell do not recombine immediately to create an uncharged particle(s). The dipole will cause the distributions of particles to shift (e.g., toward the other distribution) over time, which can also cause the net cell level of the memory cell to shift over time. If the net cell level changes enough so that program states can no longer be distinguished, the data stored in the memory cell can be lost. As a result, dipole shift can result in memory loss, and flash memory cells are typically designed to attempt to minimize the effects of such phenomena.

To provide a specific example of the foregoing, a memory cell is typically programmed/erased such that a net cell level associated with the memory cell results in a predetermined default level. Two or more predetermined default levels can be associated with digital program states. Flash memory can include two-state cells (e.g., having an un-programmed state and a programmed state, and two corresponding default cells levels that map to each state), as well as multi-state cells (e.g., a quad-bit cell can have 4 distinguishable cell levels, that correspond to an un-programmed state, and a first, second and third program state). For instance, a net cell level associated with an un-programmed state could be 2 micro coulombs of charge. Accordingly, to set a memory cell to such an un-programmed state, the net cell level would have to be programmed/erased to substantially 2 micro coulombs. As long as a concurrent charge stored in the memory cell could be distinguished from charge levels associated other states (e.g., a programmed state or first/second/third program state, and so on), the memory cell is in the un-programmed state. If, however, the cell level drifts over time due to various physical phenomena (e.g., dipole effects), the cell level can increase to 3 or 4 micro coulombs, for example. Further, if a programmed state of the memory cell maps to a 5 micro coulomb cell level, it can be difficult or impossible to determine a concurrent state of the cell if concurrent charge level drifts from 2 micro coulombs to 3 or 4. Accordingly, cell drift can lead to memory loss and/or memory read errors, where a state of a memory cell can no longer be distinguished from other states, and data is lost or falsely represented by a concurrent state of the cell.

To address the foregoing problems, the subject disclosure mitigates effects of dipole drift after an erase operation by injecting electrons via a soft program pulse after the erase pulse. In addition, the electrons can be injected proximate any distribution of un-combined holes located within the memory cell to facilitate more rapid combination between such injected electrons and the hole distribution. By causing rapid combination of holes and electrons, the dipole effect, resulting from oppositely charged particles distributed in two different portions of the memory cell (e.g., see FIG. 4), can be significantly reduced. Accordingly, cell level drift associated with such dipole effect can be mitigated.

According to additional aspects, a gate and/or drain voltage of the flash memory cell can be controlled so as to target injected particles to particular portions of a flash memory device. For instance, a relatively low gate voltage, as compared with a gate voltage utilized for programming the memory cell, can be utilized during an erase cycle or during a soft program cycle to inject particles into a channel region of a memory cell. Holes can be injected into such region during the erase cycle, and then electrons can be injected into a similar region during the soft program cycle. By injecting holes and electrons into a common region of the flash memory cell (e.g., see FIG. 5), rapid combination can result, reducing any immediate dipole effects resulting from separate distributions of non-combined electrons (e.g., associated with a program state) and holes (e.g., associated with an erase pulse). According to some aspects, a pulse width of the soft program pulse can be controlled to limit an effect of such pulse on the net cell level associated with the memory cell.

Specifically, a small pulse width can be utilized to inject minimal charge during the soft program pulse. As a result, changes to a net cell level determined during the erase pulse can be minimized to reduce immediate changes to the cell level as a result of the soft program pulse. Accordingly, cell drift can be reduced while maintaining an overall net cell level corresponding to an erased and/or un-programmed memory cell state.

The subject disclosure provides a mechanism to reduce room temperature drift in flash memory cells. Typical mechanisms for reducing cell level drift involved thinning oxide layers in such flash memory cells. These mechanisms were effective in reducing drift up to a point, and dominated much research in this matter. The subject innovation provides a non-hardware based solution, however, and can be applied to various existing flash memory cells as well as to new flash memory cell technologies. Accordingly, the subject specification provides for a significant advancement over conventional techniques.

Various aspects of the disclosure are described below. It should be apparent that the teaching herein can be embodied in a wide variety of forms and that any specific structure and/or function disclosed herein is merely representative. Based on the teachings herein one skilled in the art should appreciate that an aspect disclosed herein can be implemented independently of other aspects and that two or more of these aspects can be combined in various ways. For example, a system can be implemented and/or a method practiced using any number of the aspects set forth herein. In addition, a system can be implemented and/or a method practiced using other structure and/or functionality in addition to or other than one or more of the aspects set forth herein. As an example, many of the methods, devices, and systems described herein are described in the context of refreshing flash memory cells by way of a reprogram operation and various embodiments for controlling the operation(s) and/or triggering the operation(s). One skilled in the art should appreciate that similar techniques could apply to other communication environments as well.

As used in this disclosure, the terms "component," "system," and the like are intended to refer to a computer-related entity, either hardware, software, software in execution, firmware, middle ware, microcode, and/or any combination thereof. For example, a component can be, but is not limited to being, a process running on a processor, a processor, an object, an executable, a thread of execution, a program, and/or a computer. One or more components can reside within a process and/or thread of execution and a component can be localized on one computer and/or distributed between two or more computers. Further, these components can execute from various computer readable media having various data structures stored thereon. The components can communicate by way of local and/or remote processes such as in accordance with a signal having one or more data packets (e.g., data from one component interacting with another component in a local system, distributed system, and/or across a network such as the Internet with other systems by way of the signal). Additionally, components of systems described herein can be rearranged and/or complemented by additional components in order to facilitate achieving the various aspects, goals, advantages, etc., described with regard thereto, and are not limited to the precise configurations set forth in a given figure, as will be appreciated by one skilled in the art.

Additionally, the various illustrative logics, logical blocks, modules, and circuits described in connection with the embodiments disclosed herein can be implemented or performed with a general purpose processor, a digital signal processor (DSP), an application specific integrated circuit (ASIC), a field programmable gate array (FPGA) or other programmable logic device, discrete gate or transistor logic, discrete hardware components, or any suitable combination thereof designed to perform the functions described herein. A general-purpose processor can be a microprocessor, but, in the alternative, the processor can be any conventional processor, controller, microcontroller, or state machine. A processor can also be implemented as a combination of computing devices, e.g., a combination of a DSP and a microprocessor, a plurality of microprocessors, one or more microprocessors in conjunction with a DSP core, or any other such configuration. Additionally, at least one processor can comprise one or more modules operable to perform one or more of the steps and/or actions described herein.

Moreover, various aspects or features described herein can be implemented as a method, system, or article of manufacture using standard programming and/or engineering techniques. Further, the steps and/or actions of a method or algorithm described in connection with the aspects disclosed herein can be embodied directly in hardware, in a software module executed by a processor, or in a combination of the two. Additionally, in some aspects, the steps and/or actions of a method or algorithm can reside as at least one or any combination or set of codes and/or instructions on a machine readable medium and/or computer readable medium, which can be incorporated into a computer program product. Further, the term "article of manufacture" as used herein is intended to encompass a computer program accessible from any computer-readable device, conductive carrier interface, or media. For example, computer-readable media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Additionally, various storage media described herein can represent one or more devices and/or other machine-readable media for storing information. The term "machine-readable medium" can include, without being limited to, wireless channels and various other media capable of storing, containing, and/or carrying instruction(s) and/or data.

In addition to the foregoing, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, in this example, X could employ A, or X could employ B, or X could employ both A and B, and thus the statement "X employs A or B" is satisfied under any of the foregoing instances. In addition, the articles "a" and "an" as used in this application and the appended claims should generally be construed to mean "one or more" unless specified otherwise or clear from context to be directed to a singular form.

FIG. 1 illustrates a sample system 100 that provides reduced electron drift for flash memory cells in an erased state according to one or more aspects. System 100 can include a flash memory management module 102 that can receive an indication that an erase pulse is applied to a memory cell of a flash memory device(s) 106. The indication can be any suitable data flag, stored bit in shared memory (not depicted), received signal from control components associated with the flash memory device 106, or the like, or a combination thereof. Once the erase pulse is determined by the flash memory management module 102, a flash memory program module 104 can be updated and instructed to perform a soft memory pulse to suppress dipole effects caused by the erase pulse.

To further illustrate the dipole effect, an erase pulse can inject holes into a cell or group(s) of cells of the flash memory device 106 in order to reduce a stored level of charge from one level (e.g., that represents a program state) to a lower level of charge (e.g., that represents a lower program state or unprogrammed state). Typically, an erase pulse can include several injections of holes (e.g., via band to band tunneling or other suitable mechanism for charging a memory cell [106] with positive or negative electric charge). The goal of an erase pulse is to inject a sufficient number of holes to reduce a net charge stored in the memory cell(s) [106] to a particular level. Often this is done in steps, where each step injects holes and then measures a concurrent net memory cell charge. Once a sufficient number of holes are injected to lower the net charge in the memory cell to a predetermined level, the erase pulse is complete.

Although injecting holes (or, e.g., other suitable charged particles) can lower a net charge provided by an electron population within a cell (106), localized distributions of charge can still exist within the memory cell (106). For instance, if an injected hole does not immediately combine with an electron located within the memory cell to form a charge-neutral entity, a dipole can be created that has a net charge of zero, but a localized positive and negative charge. The dipole exerts a force on each of the two particles, which causes them to move toward each other. Such movement can then alter the net charge of the memory cell over time, resulting in memory cell drift. A dipole effect resulting from just one electron and one hole pair can be negligible; however, a stronger dipole effect resulting form a distribution of many electrons and corresponding distribution of many holes can be measurably significant relative to a default level of charge associated with one or more program states of the memory cell (106). Accordingly, a need exists to counteract the dipole effect from distributions of non-combined electrons and holes.

To mitigate dipole effects caused by distributions of holes within a flash memory cell(s) 106, flash memory program module 104 can apply a soft program pulse to the memory cell when directed by the flash memory management module 102. The soft program pulse includes a charge polarity that is opposite a polarity associated with the erase pulse. For instance, if the erase pulse injects positive charge into the memory cell(s) 106 (e.g., holes), then the soft program pulse can include and inject a negative charge (e.g., electrons) into the memory cell(s) 106. In addition, the soft program pulse can be implemented immediately after completion of the erase pulse. As a result, charge injected into the memory cell(s) 106 as part of the program pulse can help to cause immediate combination of localized un-combined charge associated with the erase pulse. By reducing localized charge distributions, the dipole effect within the memory cell can be suppressed, reducing cell level drift (e.g., change in stored charge over time). Accordingly, system 100 can provide a mechanism for stabilizing flash memory (106), both for existing technologies and new technologies, for longer periods of time as compared with conventional flash memory operation.

It should be appreciated that, although flash memory management module 102 and flash memory program module 104 are depicted as separate from flash memory 106, such components 102, 104 can reside proximate groups of flash memory cells (106), proximate a memory controller (not depicted), proximate a portable flash memory module (not depicted), or a combination thereof, or separate from such entities. Accordingly, system 100 (and other systems and methods of the subject disclosure) should not be interpreted as limited by the pictorial arrangements of components 102, 104, 106 as displayed in the associated figure(s). It should also be appreciated that flash memory (106), as referenced in the subject disclosure, can include multiple flash memory technologies including mirror-bit, floating-gate, mirror-bit quad, mirror-bit tribit, or like technology, as well as multiple flash architectures and/or interfaces such as NOR, NAND, AND, ORNAND, DDR, and so on.

Figure 2:
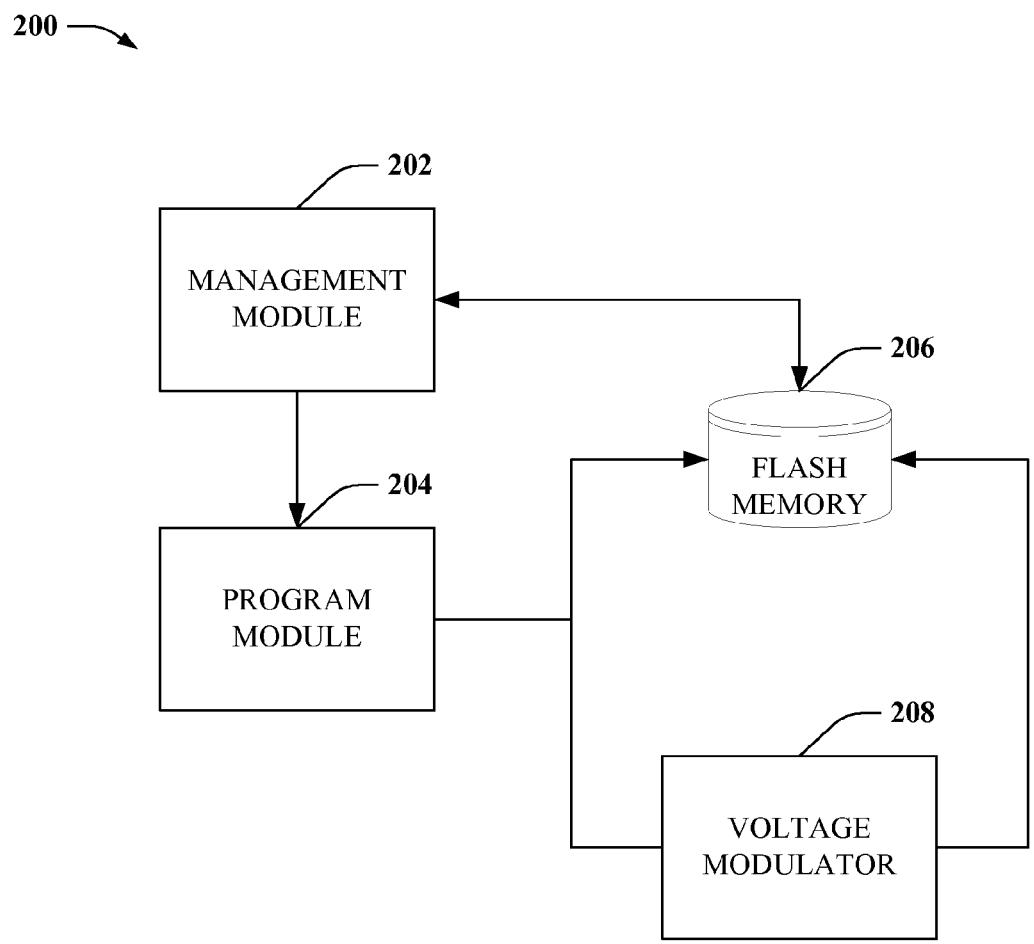
FIG. 2 depicts a sample system that provides controlled flash memory cell voltage to facilitate rapid combination of electrons and holes.

FIG. 2 depicts a sample system 200 that provides controlled flash memory cell voltage to facilitate rapid combination of localized charge within a flash memory cell (206). System 200 can include a management module 202 that can determine occurrence of an erase pulse applied to a flash memory device 206, and determine when such pulse is complete. Upon completion of the erase pulse, management module 202 can instruct program module 204 to apply a soft program pulse to the flash memory device 206, having opposite charge as the erase pulse, to facilitate neutralization of localized distribution(s) of charge resulting from the erase pulse. Accordingly, system 200 can help to mitigate cell level drift caused by dipole effects from localized distributions of charge within the memory cell(s) (106).

In addition to the foregoing, system 200 can include a voltage modulator 208 that can set a gate and/or drain voltage of the flash memory device 206 in a manner suitable to control position of injected charge in the flash memory device 206. More specifically, the voltage modulator 208 can set the gate and/or drain voltage such that charge associated with a soft program pulse is injected into a cell of the flash memory device 206 into a region of the cell that is proximate a location where uncombined charge associated with the erase pulse is located. Accordingly, by positioning injected charge near such location, rapid combination of uncombined positive charge (e.g., associated with the erase pulse) and injected negative charge (e.g., associated with the soft program pulse) can be facilitated to reduce subsequent dipole attraction within the memory cell and suppress resulting cell level drift.

According to additional embodiments, voltage modulator 208 can employ a relatively low gate voltage, as compared with a gate voltage utilized for programming cells of flash memory device 206, to inject charge associated with a soft program pulse into the cells (206). By controlling the gate voltage, the voltage modulator 208 can regulate where injected charge is located within the flash cell during a program or erase pulse. A typical gate voltage (e.g., approximately 9 to 10 volts for some flash memory technologies) for a program pulse can position charge associated with such pulse into a junction region of the flash cell. Lowering this gate voltage will inject charge associated with a program and/or erase pulse further from the junction into a channel region of the flash cell. Consequently, by analyzing a gate voltage utilized to inject charge into flash memory cell(s) (206), an approximation can be made as to where such charge is located within the cell(s).

According to one or more particular embodiments, voltage modulator 208 can set a gate voltage of the flash memory device 206 during an erase pulse to a substantially similar gate voltage utilized for programming the device (206). Thus, charge injected as a result of the erase pulse (e.g., of positive polarity) can be positioned proximate charge stored within a memory cell as a result of programming the cell (e.g., of negative polarity). Such proximity can facilitate rapid combination of much of the positive and negative charge.

According to particular aspects of the subject disclosure, it can be assumed that an uncombined distribution of erase pulse charge resides further away from a region of a flash cell where charge that corresponds to a program state resides (e.g., at a junction region of a flash memory cell). Such a result can occur because particles of opposite polarity in close proximity will generally combine into a neutral charged particular more rapidly than like particles separated by a greater distance. Consequently, if an erase pulse is injected into a region of a flash cell where an opposite charge associated with a program state exists, erase charge distributed nearest the program charge should recombine sooner than erase charge distributed further away. Therefore, an uncombined distribution of erase pulse charge is more likely to be away from the region where the program state charge resides (e.g., junction region). Accordingly, a soft program pulse injected further away from the junction region of the flash cell (e.g., into a channel region of the flash cell) is more likely to be proximate any distribution of uncombined erase pulse charge. Accordingly, in order to facilitate combination of remaining erase pulse charge residing in a flash cell (206), the soft program pulse should be concentrated away from the region where the program pulse resides and where the erase pulse was concentrated (e.g., see FIG. 6).

To effect rapid combination of program charge when erasing the flash cell, voltage modulator 208 can set the gate voltage of the flash device (206) during an erase pulse to substantially the same gate voltage as utilized for programming the device (e.g., 9.5 volts). This will concentrate charge associated with the erase pulse in a region of the flash cell proximate where the program state charge is stored. Additionally, to effect rapid combination of any uncombined erase pulse charge, voltage modulator 208 can set the gate voltage to a lower value (e.g., 7 volts) when applying the soft program pulse after the erase pulse. Accordingly, charge associated with the soft program pulse will be concentrated away from the program charge near a region more likely to have uncombined erase charge (e.g., in a channel region of the flash cell away from the junction region, see FIG. 6). As a result, charge associated with the soft program pulse can rapidly recombine with the remaining erase pulse charge, reducing dipole effects within the flash cell and suppressing cell level (e.g., $V_T$) drift.

Figure 3:
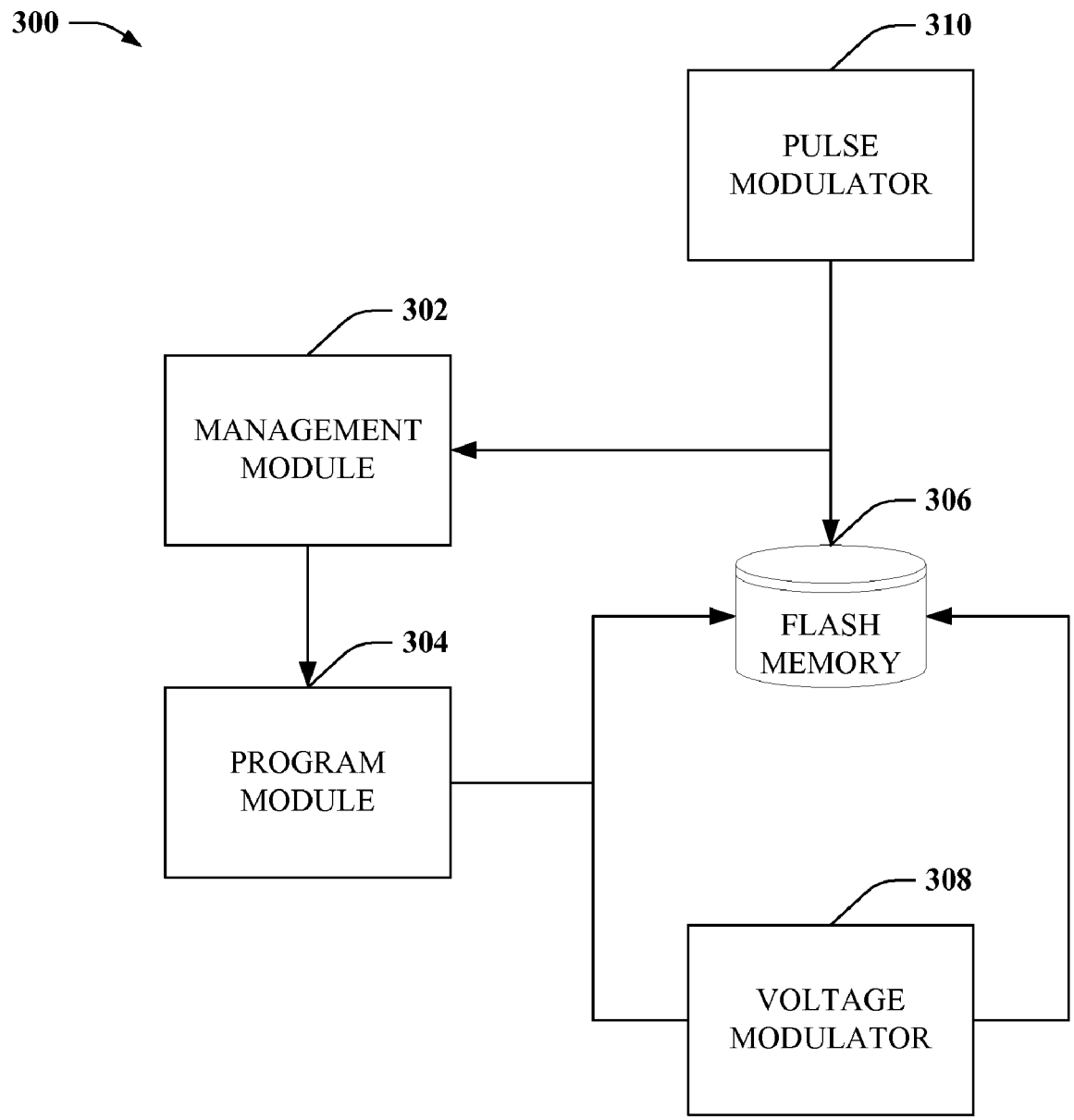
FIG. 3 illustrates an example system that can facilitate reduced room temperature dipole drift by soft program pulse after erase according to additional aspects.

FIG. 3 illustrates an example system 300 that can facilitate reduced room temperature dipole drift by soft program pulse after erase according to additional aspects of the claimed subject matter. System 300 can include a management module 302 that determines an erase pulse applied to flash memory (306) and instructs a program module 304 to apply a soft program pulse to the flash memory (306) immediately after the erase pulse to mitigate cell drift resulting from the erase pulse, as described herein. In addition, a voltage modulator 308 can control a position of injected charge during the erase pulse and soft program pulse to facilitate more rapid combination of injected and stored charge, as described with respect to FIG. 2, supra. Accordingly, system 300 can provide suppression of flash memory drift to increase flash memory stability and preserve stored data.

System 300 can further include a pulse modulator 310 that adjusts a pulse width of the soft program pulse to control an amount of charge injected into cells of the flash memory device (306) during the soft program pulse. Typically, an amount of charge injected into a flash memory cell during an erase pulse is sufficient to set a net charge of the memory cell to a predetermined value (even though net cell level can vary over time, e.g., from dipole effects, as discussed herein).

Thus, charge injected by the soft program pulse can change the net cell level of the flash memory cell. Accordingly, pulse modulator 310 can utilize a short pulse width for the soft program pulse, relative to a pulse width utilized for the erase pulse, to limit an amount of negative charge injected into the flash memory cell during the soft program pulse. Deviation in net charge as a result of the soft program pulse can therefore be minimized by pulse modulator 310. Accordingly, system 300 can suppress cell level drift in flash memory device 306 by injecting a soft program pulse into the device, and minimize the effect of such pulse on net cell level and corresponding program state.

The aforementioned systems have been described with respect to interaction between several components. It should be appreciated that such systems and components can include those components or sub-components specified therein, some of the specified components or sub-components, and/or additional components. Sub-components could also be implemented as components communicatively coupled to other components rather than included within parent components. Additionally, it should be noted that one or more components can be combined into a single component providing aggregate functionality. For instance, management module 102 can include program module 104, or vice versa, to facilitate determining occurrence of an erase pulse applied to flash memory and applying a soft program pulse to the flash memory to mitigate dipole drift effects by way of a single component. The components may also interact with one or more other components not specifically described herein but known by those of skill in the art.

Furthermore, as will be appreciated, various portions of the disclosed systems above and methods below may include or consist of artificial intelligence or knowledge or rule based components, sub-components, processes, means, methodologies, or mechanisms (e.g., support vector machines, neural networks, expert systems, Bayesian belief networks, fuzzy logic, data fusion engines, classifiers . . . ). Such components, inter alia, and in addition to that already described herein, can automate certain mechanisms or processes performed thereby to make portions of the systems and methods more adaptive as well as efficient and intelligent.

Figure 4:
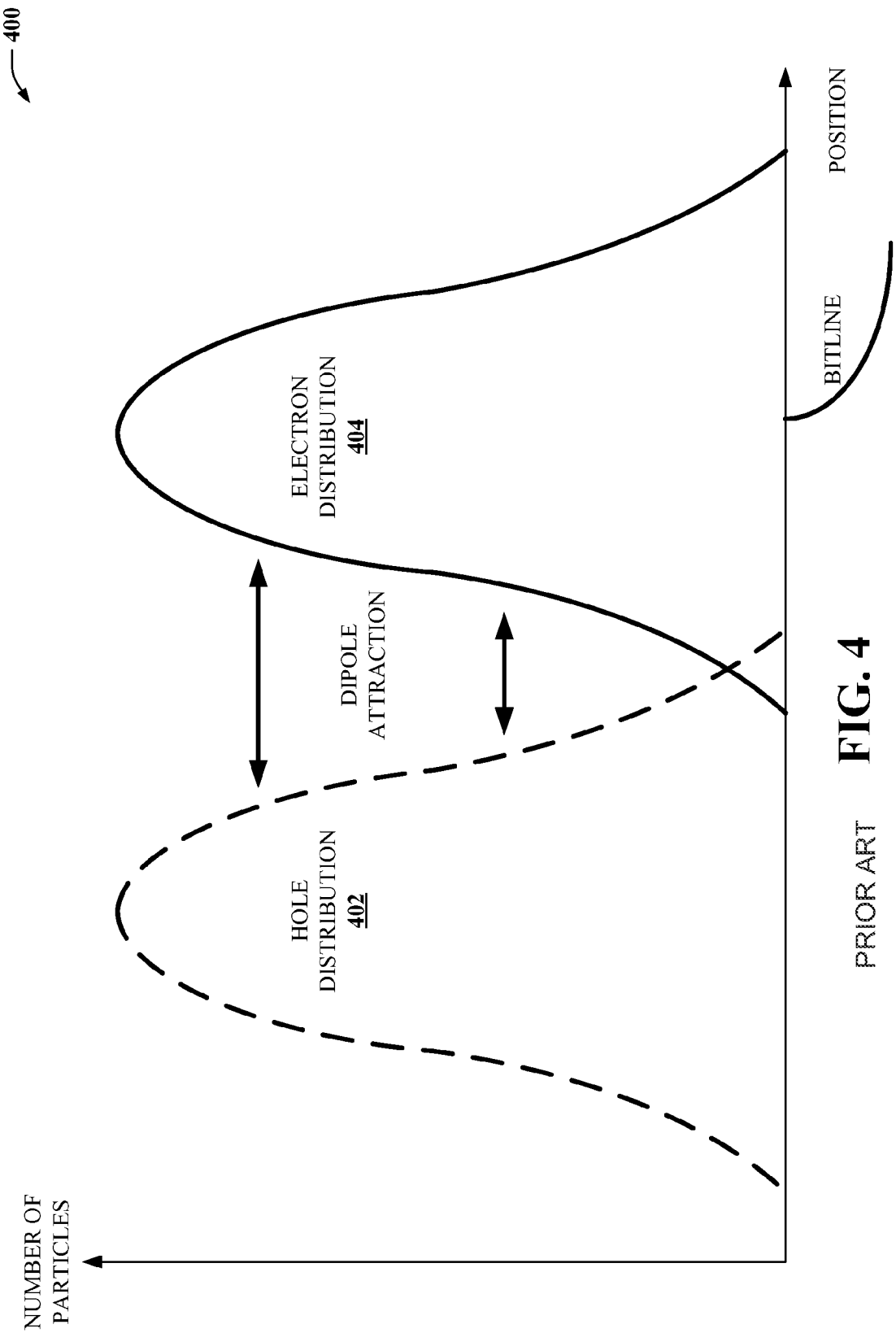
FIG. 4 illustrates an example graph depicting results of dipole attraction following an erase pulse for a flash memory cell.

FIG. 4 illustrates a graph 400 that depicts one example result of dipole attraction following an erase pulse for a flash memory cell. The graph 400 provides a depiction of numbers of particles on a vertical axis, and position within a flash memory cell on a horizontal axis. The graph 400 also depicts two example distributions (402, 404) of particles as a function of position within the flash memory cell. Distribution 402 is an example distribution of uncombined positive charge particles resulting from an erase pulse as a function of position within a flash memory cell. Distribution 404 is an example distribution of uncombined negative charge particles associated with a program state of the memory cell. Typically a region in which the two distributions (402, 404) overlap will have few uncombined particles, as the opposite polarity and the proximity between such particles will lead to relatively rapid negative-positive particle combination. Accordingly, areas having the largest numbers of erase pulse particles and program particles will typically be separated by some distance within the flash cell, as depicted at FIG. 4. Although a net memory cell voltage distribution (e.g., $V_T$ as depicted at 502 of FIG. 5) resulting from such charge distributions (402, 404) can often be substantially equal to a predetermined value (e.g., associated with an un-programmed state), the separated charge distributions (402, 404) will exert an attractive force on each other, due to their opposite charge polarity. As a result, the opposite polarity charge distributions 402, 404 will drift toward each other over time (as depicted by the arrows between the charge distributions 402, 404). The drifting distributions (402, 404) can typically cause the flash memory cell voltage level to drift away from the predetermined value (502), as depicted at FIG. 5, supra.

Figure 5:
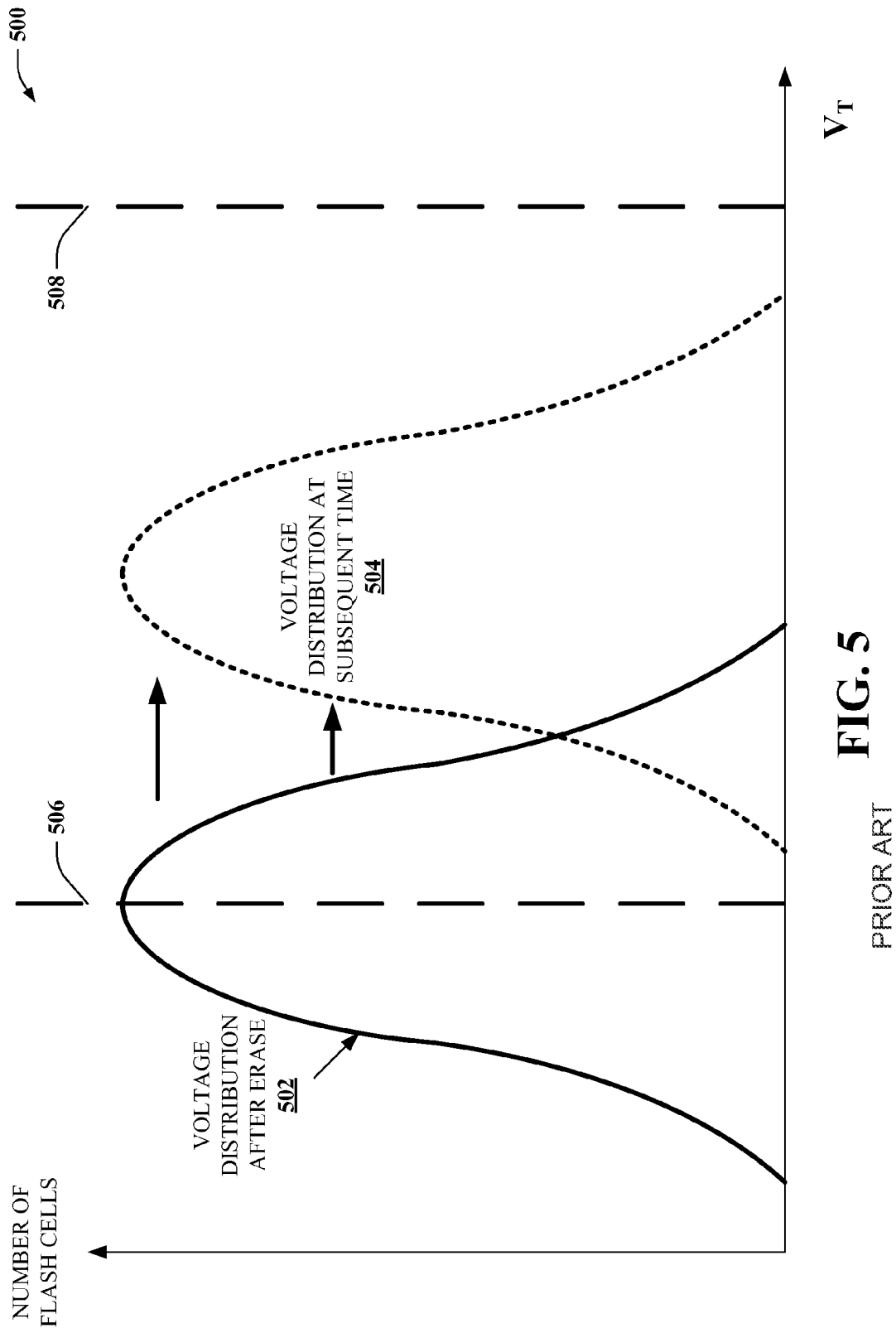
FIG. 5 depicts a sample graph that illustrates how voltage of a flash memory cell can drift subsequent an erase pulse.

FIG. 5 depicts a sample graph 500 that illustrates how voltage of a flash memory cell can drift as a result of a dipole effect caused by localized distributions of opposite charge (e.g., as depicted at 402 and 404 of FIG. 4, supra) within a flash memory cell. Graph 500 provides a depiction of net cell voltage $V_T$ on a horizontal axis for a number of flash memory cells on a vertical axis. Distribution 502 is an example of a flash cell voltage distribution immediately after an erase pulse is applied to a group of flash cells. Distribution 502 can be centered about a default $V_T$ level 506 associated with a particular program state of the flash memory cells (e.g., an unprogrammed state). Net cell voltage $V_T$ is a function of combined effects of localized charge distributions (402, 404) within the flash cells subsequent the erase pulse (e.g., as depicted at FIG. 4). Such localized distributions (402, 404) can result from program state charge (404) and erase pulse charge (402) within the flash cell, having opposite polarities, that fail to combine. Accordingly, the uncombined distributions can generate some local charge perturbations within a flash cell (402, 404).

Distribution 504 is an example of the flash cell voltage distribution some time after the erase pulse (e.g., a day, week, year, decade, etc.). The voltage distribution 504 is shifted from an original state (502) immediately after the erase pulse, which is distributed about the default $V_T$ level 506 associated with the particular program state. Such voltage shift (502, 504) can lead to degradation in stored data as the net voltage $V_T$ of the flash cells drifts away from a default level associated with the particular program state 506 to another program state 508. When a concurrent net voltage (504) of the flash cells no longer distinguishably correlates to a particular program state (506, 508), data stored by such cells can be lost. Accordingly, suppression of the voltage drift depicted by distributions 502 and 504 is desired in order to preserve integrity of flash memory and increase reliability of stored data.

Figure 6:
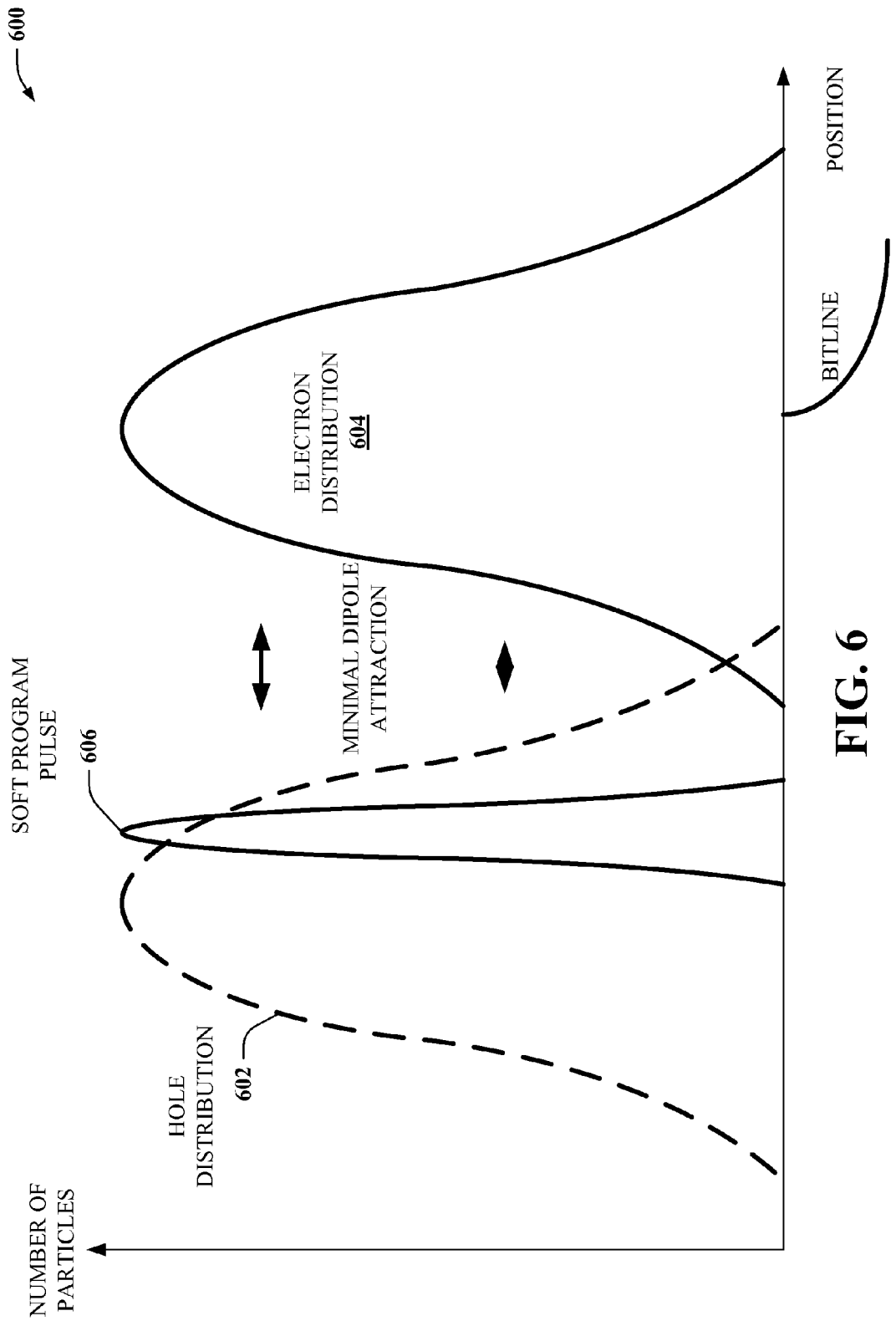
FIG. 6 illustrates an example graph of reduced dipole interactions as a result of a soft program pulse after erasing a flash memory cell according to aspects.

FIG. 6 illustrates an example graph 600 depicting an injection of charge from a soft program pulse after erasing a flash memory cell, in order to reduce dipole interactions caused by uncombined erase pulse charge according to aspects. Graph 600 depicts position within a flash memory cell along a horizontal axis, and number of charged particles along a vertical axis. Distribution 602 is an example distribution of uncombined positively charged particles as a function of position within a flash memory cell. Particles associated with distribution 602 are injected into the flash memory cell as a result of one or more erase pulses applied to the cell. Distribution 604 is an example distribution of uncombined negatively charged particles as a function of position with the flash memory cell. Particles associated with distribution 604 reside within the cell as a result of programming the cell to a cell level that corresponds to a particular program state (e.g., a program state in a single bit cell, or one of multiple program states in a multi-bit cell, such as a quad bit cell). The erase pulse injects charge (602) of opposite polarity as the program charge (604) in order to reduce the cell level of the flash cell to a value that corresponds with a lower state (e.g., an unprogrammed state).

Distributions 602 and 604 depict an example state some time after application of an erase pulse to a programmed flash cell. The erase pulse injects most of the positive charge proximate the program charge distribution 604. Accordingly, much of the erase pulse charge and program pulse charge combine immediately and result in neutral charge. As depicted at graph 600, only a minimal amount of erase pulse charge and program pulse charge that overlaps within the flash memory cell remains; most overlapping charge rapidly recombines upon application of the erase pulse. However, erase pulse charge and program charge distributed within the flash cell at a further distance can remain, as depicted by the peaks of the distributions 602 and 604. The remaining charge distributions 602, 604 will attract each other due to the opposite polarity of their respective charges, creating a perturbation in net cell voltage as described herein.

To counteract the attraction between the distributions 602, 604 of opposite charged particles, a soft program pulse (606) is injected into the flash memory cell away from the remaining program particle distribution 604 (e.g., utilizing a relatively low gate voltage as compared with a gate voltage associated with programming the cell). In the example depicted by graph 600, the soft program pulse results in a distribution of negatively charge particles 606 distributed amongst the distribution of uncombined erase pulse charge 602. Because the soft program pulse charge (606) and erase pulse charge (602) are of opposite polarity and are in close proximity, such charge will rapidly combine into neutral particles, reducing an amount of erase pulse charge within the flash memory cell and mitigating the dipole attraction between the erase charge distribution 602 and the program charge distribution 604.

In addition to the foregoing, it is noted that the distribution of particles 606 as a result of the soft program pulse has a lower distribution width within the flash cell. Such result can be due to utilization of a short pulse width for the soft program pulse. Accordingly, a relatively small amount of charge will be injected into the flash cell during the soft program pulse, and a relatively small effect on the net overall cell level (e.g., $V_T$) can result as well. Therefore, by controlling the pulse width of such soft program pulse (606) to inject a relatively small amount of charge compared to erase pulse charge, cell level drift can be suppressed while minimizing an immediate effect to the cell level as a result of soft program pulse charge (606).

Figure 7:
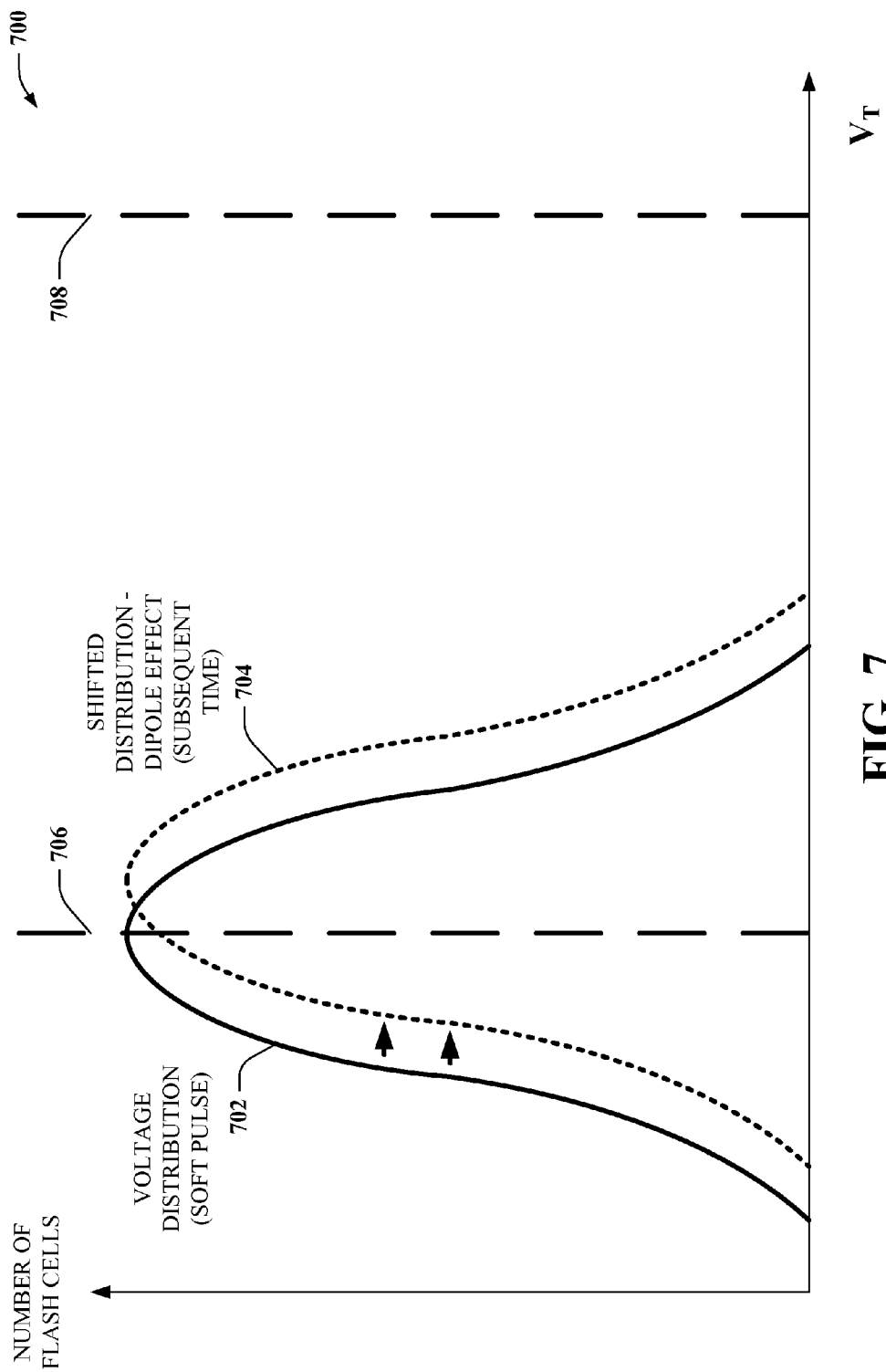
FIG. 7 illustrates a sample graph that depicts how voltage drift of a flash memory cell can be reduced by utilizing a soft program pulse after an erase pulse according to one or more aspects.

FIG. 7 illustrates a sample graph 700 that depicts how voltage drift of a flash memory cell can be reduced by utilizing a soft program pulse after an erase pulse according to one or more aspects. Graph 700 depicts a net voltage $V_T$ (e.g., combining localized charge effects, such as depicted at 602 and 604 of FIG. 6, supra) of a group of memory cells on a horizontal axis, and a number of flash memory cells on a vertical axis. Distribution 702 provides an example distribution of $V_T$ for a group of memory cells immediately after an erase pulse is applied to the group of memory cells. Distribution 704 provides an example distribution of a shift in $V_T$ for the group of memory cells over time, after a soft erase pulse is applied to the group of memory cells to reduce dipole effects of uncombined erase pulse charge and program charge. As depicted at graph 700, only a relatively small deviation in overall $V_T$ results between distributions 702 and 704. Accordingly, flash cell $V_T$ can be clearly correlated to a $V_T$ value corresponding to a first state 706 (e.g., an un-programmed state) of the flash cells as opposed to a second state 708 (e.g., first program state). Accordingly, data associated with such state(s) are preserved and the overall integrity of the flash cells improved by the reduced $V_T$ drift.

It should be appreciated that the graphs depicted at FIGS. 4 through 7 are exemplary only. The purpose of such graphs is to illustrate the effects of various aspects of the claimed subject matter in comparison with conventional flash memory systems. The graphs are not intended to be accurate or relative depictions of charge level(s) and/or $V_T$ levels of actual flash memory cells. Accordingly, the subject disclosure should not be limited by the particular example depictions provided by FIGS. 4 through 7.

Figure 8:
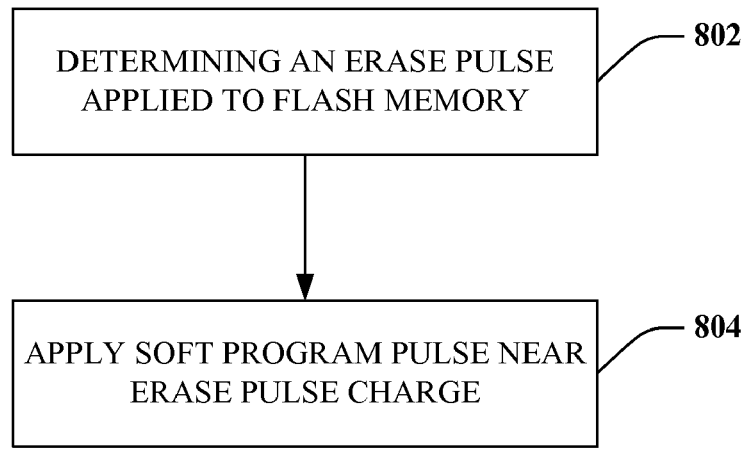
FIG. 8 depicts illustrates a sample methodology of providing a soft program pulse to reduce room temperature drift for a flash memory cell according to some aspects.
Figure 9:
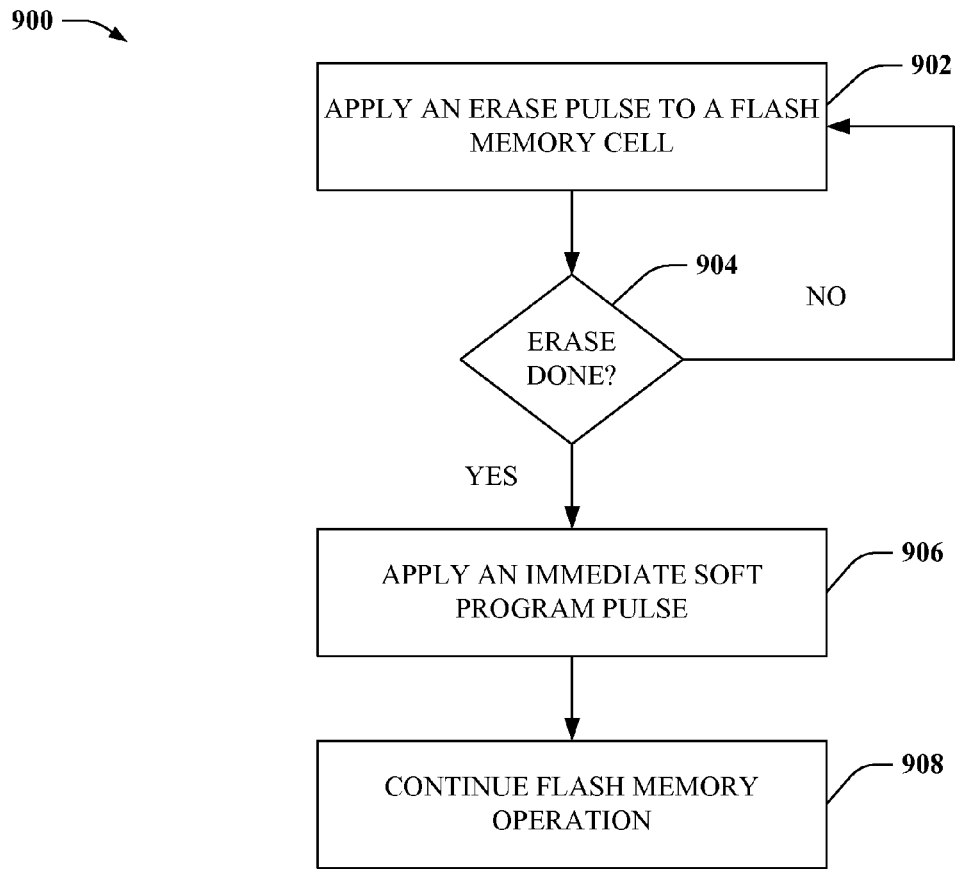
FIG. 9 depicts an example methodology for injecting a soft program pulse near to charge associated with an erase pulse to facilitate rapid combination of electron-hole pairs for a flash memory cell.
Figure 10:
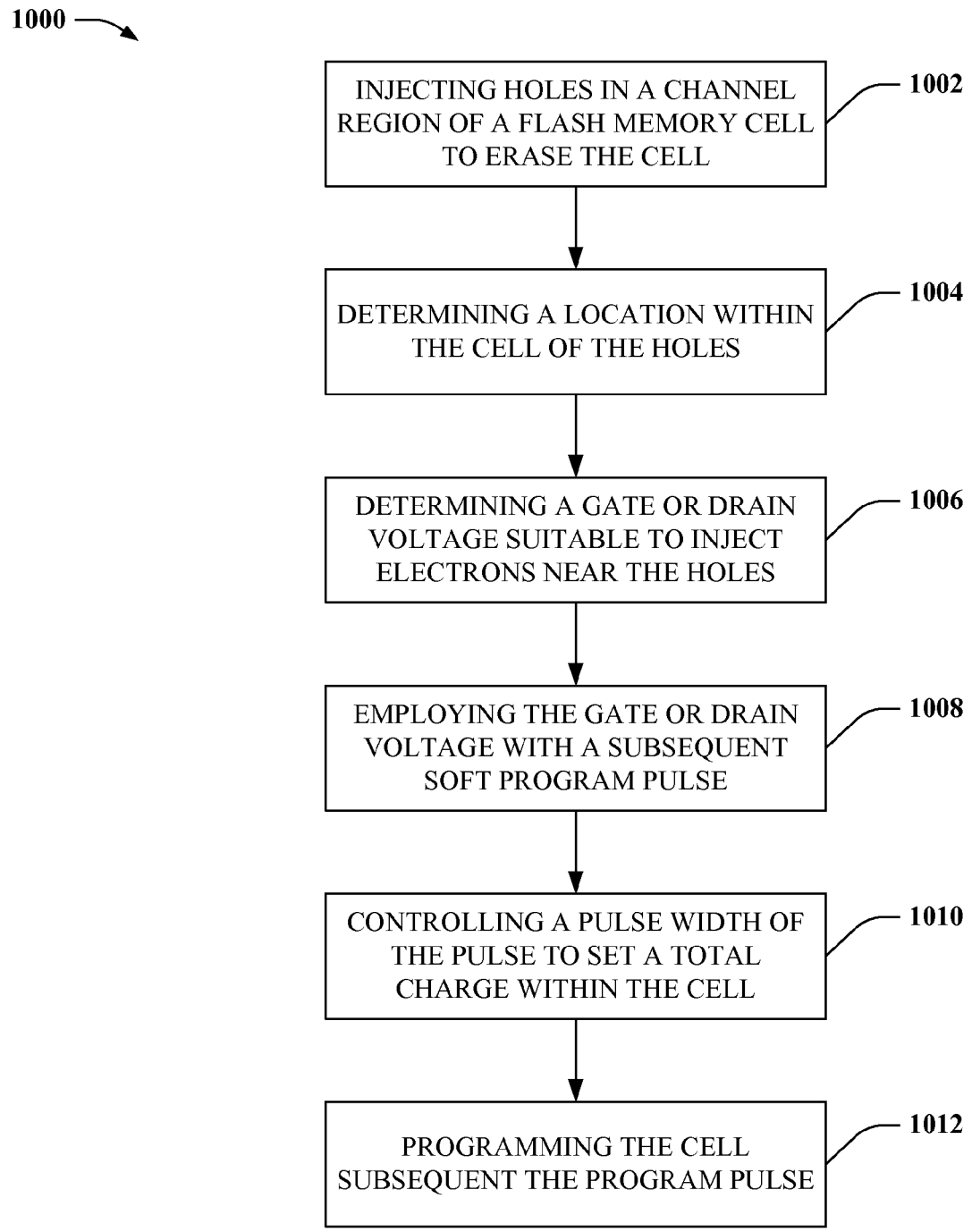
FIG. 10 illustrates an example methodology for suppressing room temperature drift for a flash memory cell according to still other aspects.

In view of the exemplary systems and distributions described supra, methodologies that can be implemented in accordance with the disclosed subject matter will be better appreciated with reference to the flow charts of FIGS. 8-10. While for purposes of simplicity of explanation, the methodologies are shown and described as a series of blocks, it is to be understood and appreciated that the claimed subject matter is not limited by the order of the blocks, as some blocks may occur in different orders and/or concurrently with other blocks from what is depicted and described herein. Moreover, not all illustrated blocks may be required to implement the methodologies described hereinafter. Additionally, it should be further appreciated that the methodologies disclosed hereinafter and throughout this specification are capable of being stored on an article of manufacture to facilitate transporting and transferring such methodologies to computers. The term article of manufacture, as used, is intended to encompass a computer program accessible from any computer-readable device, conductive carrier interface, or media.

FIG. 8 depicts illustrates a sample methodology 800 of providing a soft program pulse to reduce room temperature drift for a flash memory cell according to some aspects. Method 800 can, at 802, determine an occurrence of an erase pulse applied to flash memory. The erase pulse can involve an injection of negative charge or positive charge into cells of the flash memory, depending on a programming convention for a flash memory technology. For instance, if an accumulation of positive charge within the flash cell corresponds to one or more program states, the erase pulse will consist of negative charge particles (e.g., electrons), if an accumulation of negative charge can correspond to one or more program states, the erase pulse will consist of positive charge particles (e.g., holes). Determination of the erase pulse can include receiving an indication of such pulse from a memory controller, flash memory program element, or the like, monitoring the controller, program element, etc., for completion of the erase pulse, referencing a bit or other portion of memory (e.g., updated to indicate whether an erase pulse is applied to the flash memory), and so on. It should be appreciated that the flash memory can include any suitable type of flash memory technology, including, but not limited to, flash memory technologies such as mirror-bit, floating-gate, mirror-bit quad, mirror-bit tribit, or the like, as well as multiple flash architectures and/or interfaces such as NOR, NAND, AND, ORNAND, DDR, and so on.

At 804, method 800 can apply a soft program pulse to the flash memory. Charge associated with the soft program pulse can be of opposite polarity as charge utilized by the erase pulse, and can be distributed near uncombined erase pulse charge. For instance, a low gate voltage can be applied to the flash memory cell(s) during the soft program pulse in order to inject charge associated with such pulse into a channel region of the flash memory cell(s). Because the soft program pulse charge is proximate and of opposite polarity as the erase pulse charge, the soft program pulse can facilitate rapid combination of neutralization of at least a portion of the remaining erase pulse charge in the flash memory cell(s). Accordingly, method 800 provides for reduction in flash memory cell drift resulting from uncombined opposite polarity charge within such flash memory cell(s).

FIG. 9 depicts an example methodology 900 for injecting a soft program pulse near to charge associated with an erase pulse to facilitate rapid combination of uncombined holes in a flash memory cell associated with the erase pulse. At 902, an erase pulse can be applied to one or more cells of a flash memory device. The erase pulse can consist of positively charged holes injected into a location of the flash memory cell(s) near to negatively charged particles associated with a program state. For instance, a voltage (e.g., between 9 and 10 volts, such as 9.5 volts etc.) can be applied to the gate and/or drain region of the cell(s) that is substantially equal to a gate and/or drain voltage utilized to program the cell. Accordingly, positive charged particles associated with the erase pulse can be distributed near a region of the flash memory cell(s) where negative program charge resides (e.g., the junction region). At 904, a determination can be made as to whether the erase pulse is complete. Such determination can be based on a measurement of net cell level (e.g., $V_T$, charge, current, and/or the like) associated with the flash memory cell(s). If the net cell level is substantially equivalent to a predetermined cell level associated with a desired program state (e.g., an unprogrammed state) targeted by the erase pulse, the erase pulse can be determined complete.

As a particular non-limiting example of the foregoing, a group of flash memory cells are single bit cells having two states, an un-programmed state and a programmed state. The un-programmed state corresponds to a net cell $V_T$ of 0.5 micro-volts, and the program state corresponds to a net cell $V_T$ of 2.5 micro-volts. An erase pulse is applied to the group of flash memory cells to change a concurrent state of such cells from the program state to the un-programmed state. The erase pulse can, for instance, consist of multiple short term pulses that inject an amount of positive charge into the cell(s) (e.g., at a gate voltage suitable to position the charge near to the junction region where negative charge associated with the program state is likely to reside, as described herein). After each short term pulse, a measurement of the net $V_T$ of the cells can be conducted. The measured $V_T$ can be compared to the 0.5 micro-volts associated with the un-programmed state. Once the net $V_T$ reaches, drops below or comes within a predetermined threshold value of 0.5 micro-volts, the erase pulse can be determined complete at reference number 904.

At 906, method 900 can immediately apply a soft erase pulse upon determination that the erase pulse is complete. The soft erase pulse can consist of an injection of electrons into the flash memory cells, as described herein, to neutralize at least a portion of uncombined charge associated with the erase pulse. Further, the soft erase pulse can be performed with a gate and/or drain voltage (e.g., substantially between 6.5 and 7.5 volts, such as 7 volts) suitable to position the holes proximate a channel region of the flash memory cells, some distance (e.g., a half-width of a typical uncombined distribution of holes associated with the erase pulse) away from the junction region. Accordingly, charge injected by the soft program pulse is likely to be proximate uncombined charge associated with the erase pulse, since uncombined erase pulse charge typically will be further away from the junction region where uncombined program pulse charge will typically reside.

At 908, method 900 can resume normal operation of the flash memory cells. Normal operation can include reading and writing data to and/or from the cells, erasing and programming the cells, etc. As described, method 900 provides a post-design mechanism for reducing net cell level drift in flash memory cells after an erase pulse by reducing uncombined erase pulse charge. Conventional mechanisms for reducing cell drift involved thinning oxide layers within the cell. Although such mechanisms are successful to a degree, they cannot be applied to post-production flash memory, and are limited by a minimum oxide thickness required to maintain minimal particle leakage. The subject innovation, on the other hand, provides a mechanism to reduce cell drift in existing post-production flash memory, is applicable to many suitable flash technologies and architectures, as described herein, and is not as limited by thickness of particular cell layers as compared with the conventional technique(s). Accordingly, method 900 (and other systems and methods of the subject disclosure) can provide a significant advance in the suppression of net cell level drift.

FIG. 10 illustrates an example methodology 1000 for suppressing room temperature drift for a flash memory cell according to still other aspects. Method 1000, at 1002, can inject a positive electric charge particles into one or more flash memory cells to effect erasing and/or lowering a program state of the cells (e.g., changing a the cells from a program state to a non-programmed state), as described herein and/or as known in the art. In addition, a net cell level (e.g., voltage of a cell or voltage distribution of a group of cells that includes any localized charge within the cell) of the flash memory cells can be determined following the erasing. At 1004, a determination can be made as to a location of remaining positive charge associated with the erasing at reference number 1002, which did not combine with stored negative charge associated with a program state of the flash memory cells. At 1006, a gate and/or drain voltage is determined that is suitable to inject negative charge near to the determined location of the remaining positively charged particles. At 1008, the determined gate and/or drain voltage is employed in conjunction with applying a soft, negative charged program pulse to the flash memory cells. At 1010, a pulse width of the program pulse is controlled so as to set a total charge delivered to the cells in conjunction with the program pulse. Specifically, the pulse width is determined such that the program pulse has a minimal effect on the net cell level of the flash memory cells determined after the erasing, while still being sufficient to neutralize at least a portion of the remaining positive charge. At 1012, the cells can be optionally programmed subsequent the soft negative charge program pulse to effect subsequent programming. As described, method 1000 provides a mechanism to reduce localized charge within one or more flash memory cells as a result of an erase operation applied to such cell(s). Accordingly, dipole interactions between remaining charge distributions can be reduced, which can lower memory cell drift as described herein.

Figure 11:
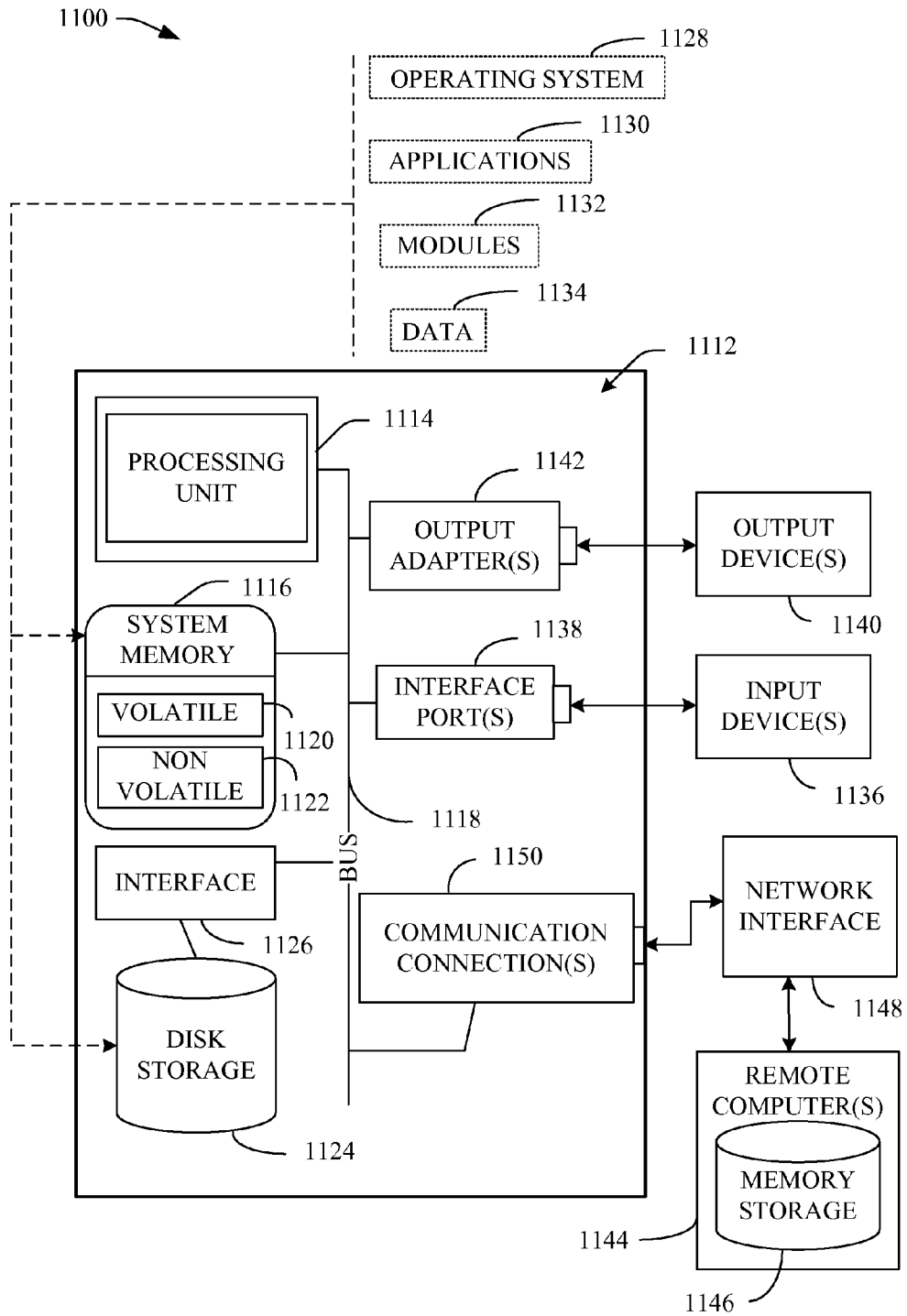
FIG. 11 depicts a sample operating system for utilizing, programming and/or erasing flash memory according to one or more aspects.

In order to provide additional context for various aspects of the disclosed subject matter, FIG. 11 as well as the following discussion is intended to provide a brief, general description of a suitable environment in which the various aspects of the disclosed subject matter may be implemented. While the subject matter has been described above in the general context of computer-executable instructions of a computer program that runs on a computer and/or computers, those skilled in the art will recognize that the invention also may be implemented in combination with other program modules.

Generally, program modules include routines, programs, components, data structures, etc. that can perform particular tasks and/or implement particular abstract data types. Moreover, those skilled in the art will appreciate that the inventive methods may be practiced with other computer system configurations, including single-processor or multiprocessor computer systems, mini-computing devices, mainframe computers, as well as personal computers, hand-held computing devices (e.g., personal digital assistant (PDA), phone, watch . . . ), microprocessor-based or programmable consumer or industrial electronics, and the like. The illustrated aspects may also be practiced in distributed computing environments where tasks are performed by remote processing devices that are linked through a communications network. However, some, if not all aspects of the invention can be practiced on stand-alone computers and/or electronic communication and/or processing devices having a flash memory interface (e.g., laptop, PDA, smart-phone, portable electronic devices such as cameras, cell phones, or the like). In a distributed computing environment, program modules may be located in both local and remote memory storage devices, described below.

With reference to FIG. 11, an exemplary environment 1110 for implementing various aspects disclosed herein includes a computer 1112 (e.g., desktop, laptop, server, hand held, programmable consumer or industrial electronics . . . ). The computer 1112 includes a processing unit 1114, a system memory 1116, and a system bus 1118. The system bus 1118 can couple system components including, but not limited to, the system memory 1116 to the processing unit 1114. The processing unit 1114 can be any of various microprocessors, such as dual microprocessors, quad microprocessors, and other multiprocessor architectures suitable for a computer environment 1110.

The system bus 1118 can be any of several types of suitable bus structure(s) including the memory bus or memory controller, a peripheral bus or external bus, and/or a local bus using any suitable variety of available bus architectures including, but not limited to, 11-bit bus, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Universal Serial Bus (USB), Advanced Graphics Port (AGP), Personal Computer Memory Card International Association bus (PCMCIA), and Small Computer Systems Interface (SCSI).

The system memory 1116 includes volatile memory 1120 and nonvolatile memory 1122. The basic input/output system (BIOS), containing the basic routines to transfer information between elements within the computer 1112, such as during start-up, is stored in nonvolatile memory 1122. By way of illustration, and not limitation, nonvolatile memory 1122 can include read only memory (ROM), programmable ROM (PROM), electrically programmable ROM (EPROM), electrically erasable ROM (EEPROM), or flash memory. Volatile memory 1120 includes random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM).

Computer 1112 also includes removable/non-removable, volatile/non-volatile computer storage media. FIG. 11 illustrates, for example, disk storage 1124. Disk storage 1124 includes, but is not limited to, devices such as a magnetic disk drive, floppy disk drive, tape drive, Jaz drive, Zip drive, LS-100 drive, flash memory card, or memory stick. In addition, disk storage 1124 can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 1124 to the system bus 1118, a removable or non-removable interface is typically used, such as interface 1126.

It is to be appreciated that FIG. 11 describes software that acts as an intermediary between users and the basic computer resources described in operating environment 1110. Such software can include an operating system 1128. Operating system 1128, which can be stored on disk storage 1124, acts to control and allocate resources of the computer system 1112. System applications 1130 take advantage of the management of resources by operating system 1128 through program modules 1132 and program data 1134 stored either in system memory 1116 or on disk storage 1124. It is to be appreciated that the present invention can be implemented with various operating systems or combinations of operating systems.

A user can enter commands or information into the computer 1112 through input device(s) 1136. Input devices 1136 can include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1114 through the system bus 1118 via interface port(s) 1138. Interface port(s) 1138 include, for example, a serial port, a parallel port, a game port, and a universal serial bus (USB). Output device(s) 1140 can utilize some of the same type of ports as input device(s) 1136. Thus, for example, a USB port may be used to provide input to computer 1112 and to output information from computer 1112 to an output device 1140. Output adapter 1142 is provided to illustrate that there are some output devices 1140 like displays (e.g., flat panel and CRT), speakers, and printers, among other output devices 1140 that require special adapters. The output adapters 1142 include, by way of illustration and not limitation, video and sound cards that provide a means of connection between the output device 1140 and the system bus 1118. It should be noted that other devices and/or systems of devices provide both input and output capabilities such as remote computer(s) 1144.

Computer 1112 can operate in a networked environment using logical connections to one or more remote computers, such as remote computer(s) 1144. The remote computer(s) 1144 can be a personal computer, a server, a router, a network PC, a workstation, a microprocessor based appliance, a peer device or other common network node and the like, and can typically include many or all of the elements described relative to computer 1112. For purposes of brevity, only a memory storage device 1146 is illustrated with remote computer(s) 1144. Remote computer(s) 1144 is logically connected to computer 1112 through a network interface 1148 and then physically connected via communication connection 1150. Network interface 1148 encompasses communication networks such as local-area networks (LAN) and wide-area networks (WAN). LAN technologies include Fiber Distributed Data Interface (FDDI), Copper Distributed Data Interface (CDDI), Ethernet/IEEE 802.3, Token Ring/IEEE 802.5 and the like. WAN technologies include, but are not limited to, point-to-point links, circuit-switching networks like Integrated Services Digital Networks (ISDN) and variations thereon, packet switching networks, and Digital Subscriber Lines (DSL).

Communication connection(s) 1150 refers to the hardware/software employed to connect the network interface 1148 to the bus 1118. While communication connection 1150 is shown for illustrative clarity inside computer 1112, it can also be external to computer 1112. The hardware/software necessary for connection to the network interface 1148 includes, for exemplary purposes only, internal and external technologies such as, modems including regular telephone grade modems, cable modems, power modems and DSL modems, ISDN adapters, and Ethernet cards or components.

What has been described above includes examples of aspects of the claimed subject matter. It is, of course, not possible to describe every conceivable combination of components or methodologies for purposes of describing the claimed subject matter, but one of ordinary skill in the art may recognize that many further combinations and permutations of the disclosed subject matter are possible. Accordingly, the disclosed subject matter is intended to embrace all such alterations, modifications and variations that fall within the spirit and scope of the appended claims. Furthermore, to the extent that the terms "includes," "has" or "having" are used in either the detailed description or the claims, such terms are intended to be inclusive in a manner similar to the term "comprising" as "comprising" is interpreted when employed as a transitional word in a claim.

What is claimed is:

1. A system that provides reduced electronic drift for memory cells of a flash memory device, comprising:
    a flash memory management module that receives an indication that an erase pulse is applied to a flash memory cell of a flash memory device;
    a flash memory program module that applies a soft program pulse to the flash memory cell when directed by the flash memory management module, the soft program pulse includes a charge polarity that is opposite a polarity of the erase pulse; and
    a pulse modulator that adjusts a pulse width of the soft program pulse to control an amount of charge injected into the flash memory cell during the soft program pulse, wherein the pulse modulator employs a relatively small pulse width, compared to a pulse width of the erase pulse, for the soft program pulse, wherein voltage level and the pulse width of the soft program pulse are selected to control the application of the soft program pulse such that charge injected into the flash memory cell is concentrated in a channel region proximate to uncombined erase charge and away from another region of the flash memory cell wherein at least a portion of remaining program charge resides in order to combine at least a portion of the charge and the uncombined erase charge to reduce dipole interactions between the uncombined erase charge and the remaining program charge to thereby reduce the electronic drift in the flash memory cell.

2. The system of claim 1, comprising a voltage modulator that adjusts at least one of a gate voltage or a drain voltage of the flash memory device during the soft program pulse to inject the charge associated with the soft program pulse proximate to the uncombined erase charge.

3. The system of claim 2, the voltage modulator adjusts the gate voltage or the drain voltage to inject the charge associated with the soft program pulse into the channel region of the flash memory cell.

4. The system of claim 2, the voltage modulator sets the gate voltage or the drain voltage of the flash memory cell to a low voltage value, as compared with a program voltage value utilized to program the flash memory cell, to inject the charge associated with the soft program pulse.

5. The system of claim 2, the voltage modulator sets the gate voltage of the flash memory cell to a pulse voltage value, to inject the charge associated with the soft program pulse, that is substantially equal to between two and three volts lower than a program voltage value utilized to program the flash memory cell.

6. The system of claim 2, the voltage modulator adjusts the at least one of the gate voltage or the drain voltage of the flash memory cell during the erase pulse in a manner that injects the erase charge associated with the erase pulse proximate to a location within the flash memory cell where charge associated with a program state of the flash memory cell is located.

7. The system of claim 2, the voltage modulator adjusts the gate voltage to a predefined voltage value during the soft program pulse to control the application of the soft program pulse such that the charge injected into the flash memory cell is concentrated away from remaining program charge and near a region of the flash memory cell that is identified as being more likely to have uncombined erase charge after the erase pulse.

8. The system of claim 1, the flash memory management module directs the flash memory program module to apply the soft program pulse to the flash memory cell immediately after application of the erase pulse to the flash memory cell is completed.

9. The system of claim 1, the soft program pulse injects electrons into the flash memory cell and the erase pulse injects holes into the flash memory cell.

10. A method of providing reduced electronic drift in flash memory cells, comprising:
   determining occurrence of an erase pulse applied to a flash memory cell;
   injecting electric charge into the flash memory cell after the erase pulse but prior to a subsequent program pulse, the electric charge is of opposite polarity compared to a charge associated with the erase pulse;
   employing a relatively small pulse width for the injecting of the electric charge, as compared with a pulse width of a program cycle or an erase cycle, to limit a number of electrons deposited into the flash memory cell; and
   selecting a voltage level and the small pulse width to control application of a soft program pulse to be applied to the flash memory cell to facilitate the injection of the electric charge, wherein the voltage level and the small pulse width are selected such that the electric charge injected into the flash memory cell is concentrated in a channel region proximate to non-combined erase charge and away from another location of the flash memory cell wherein at least a portion of remaining program charge resides in order to facilitate combining at least a portion of the electric charge and the non-combined erase charge to reduce dipole interactions between the non-combined erase charge and the remaining program charge to thereby reduce the electronic drift in the flash memory cell.

11. The method of claim 10, comprising determining a location within the flash memory cell where the non-combined charge associated with the erase pulse resides.

12. The method of claim 10, comprising injecting the electric charge at a location within the flash memory cell that is proximate to where the non-combined erase charge associated with the erase pulse resides.

13. The method of claim 12, comprising employing a small gate voltage in conjunction with injecting the electric charge, relative to a gate voltage utilized for programming the flash memory cell, to facilitate injecting the electric charge at the location proximate to where the non-combined erase charge associated with the erase pulse resides.

14. The method of claim 10, comprising programming the flash memory cell to a cell level associated with a desired program state after the electric charge is injected into the flash memory cell.

15. The method of claim 10, comprising employing electrons for the electric charge in response to holes being injected into the flash memory cell during the erase pulse.

16. The method of claim 10, comprising concentrating the electric charge, during the injecting of the electric charge, away from program charge and near a region of the flash memory cell that is determined to be more likely to have uncombined erase charge after the erase pulse.

17. A system that provides reduced electronic drift for flash device memory cells, comprising:
   means for receiving a command to initiate an erase pulse for a flash memory cell;
   means for erasing the flash memory cell by using the erase pulse to inject erase charge to decrease stored charge associated with a program state;
   means for adjusting at least one of a drain voltage or a gate voltage of the flash memory cell to control placement of injected electric charge in the flash memory cell during a soft program pulse;
   means for immediately applying the soft program pulse, after completion of the erase pulse, to inject the electric charge proximate to a non-combined portion of the erase charge associated with the erase pulse, wherein the soft program pulse has a smaller pulse width relative to a pulse width of an erase cycle associated with the erase pulse, to mitigate charge drift within the flash memory cell, wherein the smaller pulse width and voltage level of the at least one of a drain voltage or the gate voltage are adjusted to control the application of the soft program pulse such that the electric charge injected into the flash memory cell is concentrated in a channel region closer to non-combined erase charge and relatively further away from another region of the flash memory cell wherein remaining program charge resides in order to combine at least a portion of the electric charge and the non-combined erase charge to reduce dipole interactions between the non-combined erase charge and the remaining program charge to thereby reduce the electronic drift in the flash memory cell.

18. The system of claim 17, comprising means for determining the at least one of the gate voltage or the drain voltage suitable to position the electric charge closer to the erase charge associated with the erase pulse.

19. The system of claim 18, the means for determining the at least one of the gate voltage or the drain voltage also determines an erase voltage value for the gate voltage or the drain voltage suitable for injecting the erase charge associated with the erase pulse proximate a location within the flash memory cell where program charge associated with a program state of the flash memory cell is located.

20. The system of claim 18, the electric charge is positioned proximate to the non-combined erase charge by applying a small gate voltage across the flash memory cell during the soft program pulse, the small gate voltage is smaller relative to a gate voltage utilized for programming the flash memory cell.

21. The system of claim 20, the small gate voltage is substantially equal to between two volts and three volts less than the gate voltage utilized for programming the flash memory cell.

22. The system of claim 17, comprising means for controlling a pulse width of the soft program pulse to facilitate controlling an amount of the electric charge injected into the flash memory cell in conjunction with the soft program pulse.

23. A computer program product, comprising:
   a non-transitory computer readable medium containing instructions configured to cause a computer or electronic device to reduce electronic drift for at least one flash memory cell, comprising:

at least one instruction configured to cause a computer or electronic device to determine occurrence of an erase pulse applied to the at least one flash memory cell;

at least one instruction configured to cause a computer or electronic device to apply a soft program pulse to inject electric charge into the at least one flash memory cell immediately after the erase pulse, the electric charge is of opposite polarity compared to a charge associated with the erase pulse; and at least one instruction configured to cause a computer or electronic device to adjust a pulse width of the soft program pulse to control an amount of the electric charge injected into the at least one flash memory cell during the soft program pulse, wherein the soft program pulse has a pulse width that is relatively smaller than a pulse width of the erase pulse, wherein voltage level and the pulse width of the soft program pulse are selected to control the application of the soft program pulse such that the electric charge injected into the at least one flash memory cell is concentrated in a channel region proximate to uncombined erase charge and away from another region of the at least one flash memory cell wherein at least a portion of remaining program charge resides in order to combine at least a portion of the electric charge and the uncombined erase charge to reduce dipole interactions between the uncombined erase charge and the remaining program charge to thereby reduce dipole shift in the at least one flash memory cell.

24. The computer program product of claim 23, the instructions further comprising at least one instruction configured to cause a computer or electronic device to determine a gate voltage or a drain voltage to apply to the at least one flash memory cell suitable to position the electric charge injected into the at least one flash memory cell proximate to the uncombined erase charge associated with the erase pulse.

25. The computer program product of claim 23, the instructions further comprising at least one instruction configured to cause a computer or electronic device to determine a gate voltage or a drain voltage of the at least one flash memory cell suitable to inject the erase charge associated with the erase pulse proximate to a location within the at least one flash memory cell where charge associated with a program state of the at least one flash memory cell is located.

* * * * *